United States Patent [19]

Falanga

[11] Patent Number: 4,746,583
[45] Date of Patent: May 24, 1988

[54] CERAMIC COMBINED COVER

[75] Inventor: Richard J. Falanga, Utica, N.Y.

[73] Assignee: Indium Corporation, New Hartford, N.Y.

[21] Appl. No.: 933,568

[22] Filed: Nov. 21, 1986

[51] Int. Cl.⁴ .............................................. B32B 15/04
[52] U.S. Cl. ..................... 428/632; 428/620; 428/660; 428/665; 428/670; 428/672; 428/673; 220/200; 220/359; 174/52 FP
[58] Field of Search .................. 174/52 FP; 220/200, 220/359; 428/620, 632, 660, 665, 670, 672, 673, 680

[56] References Cited

U.S. PATENT DOCUMENTS

| | | |
|---|---|---|
| 3,107,756 | 10/1963 | Gallet .................................. 428/632 |
| 3,340,602 | 2/1965 | Hontz ..................................... 29/588 |
| 4,291,815 | 9/1981 | Gordon et al. ..................... 220/200 |
| 4,331,253 | 5/1982 | Gordon et al. ..................... 220/200 |
| 4,331,258 | 5/1982 | Geschwind ......................... 220/359 |
| 4,356,047 | 10/1982 | Gordon et al. ..................... 220/200 |
| 4,513,062 | 4/1985 | Suzuki et al. ........................ 428/665 |

Primary Examiner—Dewayne L. Rutledge
Assistant Examiner—George Wyszomierski
Attorney, Agent, or Firm—Wall and Roehrig

[57] ABSTRACT

A combination ceramic sealing cover for a semiconductor package has a flat ceramic lid member with metallization applied as a foundation for a seal ring or frame portion. On the metallized layer is a gold-tin solder layer, in the form of either a solder ring that is tack welded on, or solder paste that is screened onto the base metallization and furnace reflowed.

12 Claims, 1 Drawing Sheet

CERAMIC COMBINED COVER

BACKGROUND OF THE INVENTION

This invention relates to hermetic sealing covers for enclosures or containers, and is more particularly directed to combination sealing covers or lids with incorporated sealing rings for packages for semiconductor devices.

Previous sealing covers and lids have been proposed to produce a package that is resistant to corrosion, especially in salt atmospheres. This is required to satisfy specifications of finished packages, such as Mil-Std-883C, Method 1009, Test Condition A, Salt Atmosphere (corrosion).

In the packaging of high reliability micro-circuits, a semiconductor ship is typically housed with a cavity formed in a ceramic housing and a lid is sealed to the housing to close the package. This lid is generally formed of an iron based metal called Kovar and the seal is formed by a pre-formed solder frame that is placed between the lid and package housing. In U.S. Pat. No. 3,946,190 there is described what is generally referred to as a combination cover wherein the solder frame is tack welded to the Kovar lid. The combination cover is capable of being hermetically sealed to the package to protect the enclosed chip.

The Kovar lid of a high reliability package is typically electroplated with a base coating of nickel and a final coating of pure gold. The nickel layer is usually about 100 micro inches thick while the gold outer layer is about 50 micro inches thick. The gold overlayer provides an oxide free surface for the solder which insures that the solder will uniformly wet the lid and thus produce the desired hermetic seal. It should be noted, however, that both coating layers are crystalline in form and thus contain cracks at the grain boundaries along which corrosive atmospheres can attack the iron base Kovar substrate. When this occurs the lid will rust and the protective coating will spall or flake away further promoting and accelerating the rusting process. This leads to premature failure of the package and degradation of the housed device.

Many high reliability packages are now expected to meet the requirements set out in the military specifications Mil-Std-883 C, Method 1009, Test Condition A, which is a salt atmosphere test. Under this test, the closure lids are exposed to a salt spray atmosphere under closely controlled climatic conditions. After twenty four hours to exposure to the corrosive atmosphere, the lids are washed and rinsed thoroughly and then inspected under a microscope to determine if the part has been adversely affected. A nickel-gold plated Kovar lid will invariably fail this test.

In an effort to adapt the Kovar lid to meet military specifications, a multi-coated structure has been devised wherein four coating layers rather than two are electroplated over the Kovar substrate.

One such lid is described in U.S. Pat. No. 4,601,958 to Levine. This lid is formed of a Kovar substrate (Kovar is an alloy of nickel iron and cobalt), covered with alternate layers of nickel and gold electroplate. The lid is affixed, using an 80/20 Au/Sn solder ring preform, to the semiconductor package. These lids are quite resistant to corrosion. However, because the Kovar base is corrosible, the entire lid must be completely covered with the Ni and Au plated layers. The nickel electroplate process is rather slow, which leads to long process times and hence high cost. Also, the two gold layers increase the expense of the lid considerably. Moreover, if a lid is defective and it is necessary to scrap the lid, the buried gold layer is not salvageable, so its gold value is lost.

The semiconductor industry has long sought a cover which would be extremely corrosion resistant, but could be easily manufactured with a minimum use of precious metals.

OBJECTS AND SUMMARY OF THE INVENTION

It is an object of this invention to provide a combination cover which is corrosion proof, and which avoids the drawbacks of the prior art.

It is a more particular object of the invention to provide such a cover which is reliable and can be manufactured easily and at low cost.

It is another object of this invention to provide a combination cover which can satisfy rigid and rigorous corrosion testing, such as Mil-Std-883C, Method 1009, Test Condition A, Salt Atmosphere (Corrosion).

It is still another object of this invention to provide a semiconductor package cover that uses a minimal amount of precious metal.

According to one aspect of this invention, a semiconductor device package has a lid that is formed as a flat ceramic sheet substrate. One side of the substrate faces the package, and a plural-layer sealing ring is formed on the perimeter of that side. The sealing ring includes a precious metal layer formed directly on the ceramic substrate, and a solder layer on the precious metal layer on the side away from the substrate. The metal layer can be, for example, a Mo-Mn, or pure W, or Mo-W refractory metallization, covered with nickel deposition and gold electroplate, the latter providing a surface for wetting the solder layer. The solder layer can be a solder paste that is screened on, or can be a gold-tin solder frame that is tack welded on. In alternative embodiments the base metal layer can be a gold thick-film or a Pd-Ag thick-film.

In another embodiment, the base layer metallization can be an active metal process, such as titanium alloy, which is covered with nickel followed by gold.

The above and many other objects, features, and advantages of this invention will become more fully apparent from the ensuing detailed description of several preferred embodiments of this invention, which is to be read in connection with the accompanying drawing.

DETAILED DESCRIPTION OF THE PREFERRED EMBODIMENTS

Figure 1:
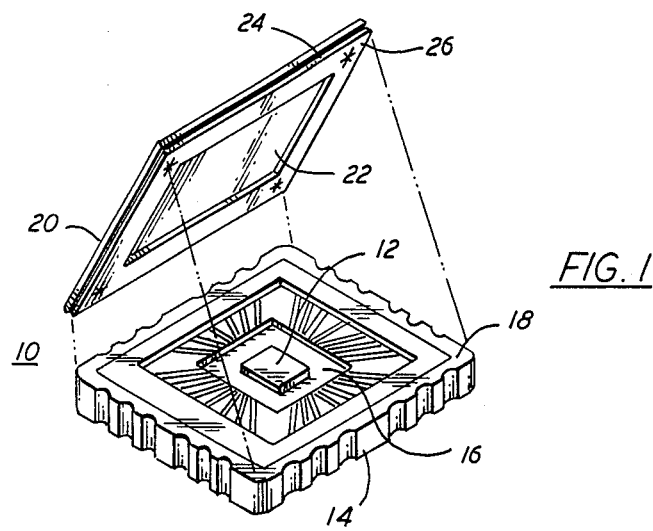
FIG. 1 is a perspective view of a semiconductor package with a combination cover formed of a ceramic lid and a thick-film metallized sealing ring, according to an embodiment of this invention.

With reference to the drawings, FIG. 1 shows a semiconductor package assembly 10 for encapsulating a semiconductor device 12, such as an integrated circuit. The package has a main body 14 with a cavity 16 therein for receiving the semiconductor device 12. The body 14 has a conductive ring or frame 18 for receiving a hermetically sealing combination cover 20. Here, the cover 20 has as the lid a ceramic sheet substrate 22 of a nominal thickness of about 0.025 inches. The substrate 22 can be of any suitable ceramic material, such a black alumina, white alumina, or sapphire. The latter material is useful for encapsulating programmable read only memories (PROM'S) as it permits reprogramming using ultraviolet light.

The ceramic cover 20 has, on the periphery of the surface of the substrate 22 that faces the body 14, a sealing ring formed by either refractory or active metallization either cofired with the ceramic ("green tape" process) or fired after the ceramic and then electroplated with a solderable metal or covered using a thick-film metallization technique. The base metallization layer 24 is of a material that is capable of being wetted by gold-tin solder of the layer 26, or else is plated with a metal that is so capable. The solder layer is an 80/20 Au/Sn ring tack welded on, or an Au/Sn solder paste, which is screened on over the base metallization layer 24, and then reflowed.

Figure 2:
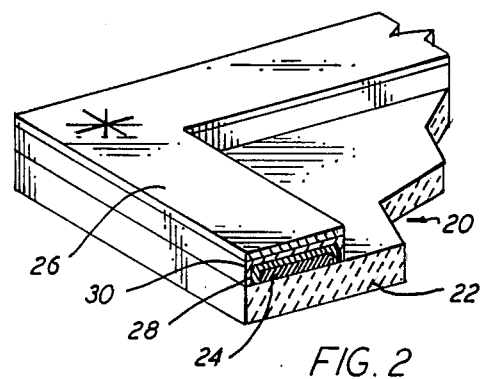
FIGS. 2, 3, 4 and 5 are partial perspective views of ceramic combination covers according to respective embodiments of this invention.

A first embodiment of the lid of this invention is shown in FIG. 2. Here the ceramic substrate 22 carries a selectively applied base metallization 24 which can be of a refractory molybdenum-manganese material, but is preferably a pure tungsten or molybdenum-tungsten material. This layer, which is either co-fired with the ceramic material, or is laid down and fired on a previously fired ceramic substrate, has a minimum thickness of five microns. The metal layer 24 is covered with a layer of nickel electroplate 28, with a thickness of approximately one hundred micro inches, and this layer 28 is followed by a gold electroplate layer 30 of approximately fifty micro inches. The solder layer 26 is here in the form of a pre-cut gold-tin solder frame, which is tack welded onto the gold layer 30. The gold layer 30 is readily wettable by the solder layer 26, and is also extremely corrosion resistant.

Figure 3:
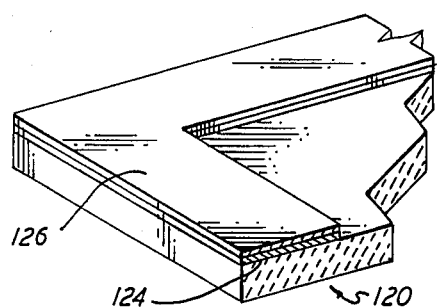

A cover 120 according to a second embodiment of this invention is shown in FIG. 3, and comprises a flat ceramic substrate 122 to which is selectively applied a precious metal thick-film ring layer 124, with a minimum thickness of ten micro meters. The preferred material for this embodiment is Dupont 9110, or equivalent. This is an oxide/glass mix bonded gold system. After this layer 124 is fired, a layer 126 of gold-tin solder paste is screened on, and is furnace reflowed.

Figure 4:
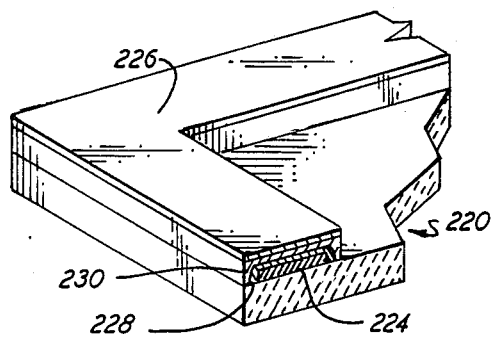

A cover 220 according to a third embodiment of this invention is shown in FIG. 4, and comprises a flat ceramic substrate 22 which carries a titanium alloy active metallization layer 224. This layer 224 is preferably at least five microns in thickness. After firing the metallization layer 224, a nickel electroplate layer 228 of approximately one hundred micro inches thickness, and a gold electroplate layer 230 of approximately fifty micro inch thickness, are deposited in that order atop the thick-film layer 224. Then, a gold-tin solder paste layer 226 is screened on and reflowed.

Figure 5:
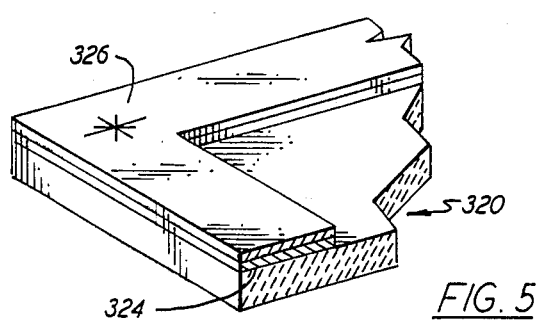

A cover or layer 320 according to a fourth embodiment of this invention is shown in FIG. 5. Here, a ceramic substrate 322 has a palladium-silver thick-film layer 324 with a thickness of ten micro meters laid down on the substrate 322 and subsequently fired. The palladium-silver thick-film material is preferably Dupont 6120 or Dupont 6124, or equivalent. These are oxide/glass mix bonded palladium/silver compositions. In this embodiment, a gold-tin solder ring 326 is tack welded directly onto the palladium-silver thick-film layer 324.

The layer 24 or 224 can be co-fired with the ceramic substrate 22 or 220, or can be fired separately on previously kilned ceramic material. The furnace reflow of the solder layer 26, 126, 226, 326 takes place typically with a dwell time of two minutes at 350° C., in a dry nitrogen atmosphere.

The details of the process of forming these covers is described in my co-pending application Ser. No. 933,567, filed Nov. 21, 1986.

The technique for tack welding of the solder ring 26 or 326 is well known, and the details need not be described here.

Of course, the solder layer 26 can be another precious metal based solder, and another noble metal could be substituted for gold in the electroplated layer 30 or 230.

While the invention has been described in detail with respect to certain preferred embodiments, it should be understood that these embodiments represent only a few of many possible embodiments, and that many modifications and variations thereof would present themselves to those of skill in the art without departing from the scope and spirit of this invention as defined in the appended claims.

What is claimed is:

1. A ceramic sealing cover for a semiconductor package comprising
    a flat ceramic sealing member having one side facing said package, said one side having a perimeter; and
    a plural layer sealing ring formed at said perimeter and adhered to said perimeter, said sealing ring including
        a metallized layer formed on said ceramic sealing member,
        an electroplated nickel layer followed by an electroplated gold layer, and
        a solder layer affixed over said electroplated gold layer.

2. A ceramic sealing cover according to claim 1 in which said metallized layer is a thick-film metallization.

3. A ceramic sealing cover for a semiconductor package comprising;
    a flat ceramic sealing member having one side facing said package, said one side having a perimeter; and
    a plural layer sealing ring formed at said perimeter and adhered to said perimeter, said sealing ring including
        a metallized layer formed of a titanium alloy at least five microns thick deposited on said ceramic sealing member, and
        a solder layer over said metallized layer on the side away from said ceramic sealing member.

4. A ceramic sealing cover according to claim 3, further comprising, atop said titanium alloy layer, an electroplated noble metal layer.

5. A ceramic sealing cover according to claim 3, further comprising, atop said titanium alloy layer, an electroplated nickel layer followed by an electroplated gold layer, with said solder layer being affixed onto said gold layer.

6. A ceramic sealing cover for a semiconductor package comprising
    a flat ceramic sealing member having one side facing said package, said one side having a perimeter; and
    a plural layer sealing ring formed at said perimeter and adhered to said perimeter, said sealing ring including a gold thick-film metallized layer at least ten microns thick formed on said ceramic sealing member, and a solder layer over said metallized layer on the side away from said ceramic sealing member.

7. A ceramic sealing cover according to claim 6, in which said gold thick-film is oxide/glass mix bonded gold system sold as Dupont 9110.

8. A ceramic sealing cover according to claim 6, in which said solder layer is formed directly on said gold thick-film layer.

9. A ceramic sealing cover for a semiconductor package comprising a flat ceramic sealing member having one side facing said package, said one side having a perimeter; and a plural layer sealing ring formed at said perimeter and adhered to said perimeter, said sealing ring including a palladium-silver thick-film metallized layer at least ten microns thick formed on said ceramic sealing member, and a solder layer over said metallized layer on the side away from said ceramic sealing member.

10. A ceramic sealing cover according to claim 9, in which said palladium-silver thick-film is oxide/glass mix bonded Pd-Ag system, sold as Dupont 6120.

11. A ceramic sealing cover according to claim 9, in which said palladium-silver thick-film is oxide/glass mix bonded Pd-Ag system, sold as Dupont 6134.

12. A ceramic sealing cover according to claim 9, in which said solder layer is affixed directly on said palladium-silver thick-film.

* * * * *